United States Patent
Rahmoun et al.

(10) Patent No.: US 12,158,486 B2
(45) Date of Patent: Dec. 3, 2024

(54) MOBILE ELECTRIC ENERGY SUPPLY DEVICE

(71) Applicant: ads-tec Energy GmbH, Nürtingen (DE)

(72) Inventors: Ahmad Rahmoun, Bad Urach (DE); Daniel Ziegler, Reutlingen (DE)

(73) Assignee: ADS-TEC ENERGY GMBH, Nürtingen (DE)

( * ) Notice: Subject to any disclaimer, the term of this patent is extended or adjusted under 35 U.S.C. 154(b) by 35 days.

(21) Appl. No.: 17/879,058

(22) Filed: Aug. 2, 2022

(65) Prior Publication Data

US 2023/0030349 A1    Feb. 2, 2023

(30) Foreign Application Priority Data

Aug. 2, 2021   (DE) .......................... 102021120050.4

(51) Int. Cl.
| | | |
|---|---|---|
| *G01R 27/08* | (2006.01) | |
| *G01R 31/52* | (2020.01) | |
| *H02H 1/00* | (2006.01) | |
| *H02H 3/16* | (2006.01) | |
| *H02H 5/12* | (2006.01) | |
| *H02H 9/00* | (2006.01) | |

(52) U.S. Cl.
CPC ............. *G01R 27/08* (2013.01); *G01R 31/52* (2020.01); *H02H 1/0007* (2013.01); *H02H 3/16* (2013.01); *H02H 5/12* (2013.01); *H02H 9/008* (2013.01); *Y02T 90/12* (2013.01)

(58) Field of Classification Search
CPC ....... G01R 31/52; G01R 27/08; H02J 7/0029; H02J 7/0042; H01R 4/66; H02H 1/0007; H02H 3/044; H02H 3/16; H02H 5/12; H02H 9/008

See application file for complete search history.

(56) References Cited

U.S. PATENT DOCUMENTS

| | | | |
|---|---|---|---|
| 2020/0169098 A1 | 5/2020 | Spesser | |
| 2021/0096167 A1* | 4/2021 | Erk | ........................ B60L 3/0069 |

FOREIGN PATENT DOCUMENTS

| | | |
|---|---|---|
| CN | 205429808 U | 8/2016 |
| DE | 102018102208 A1 * | 8/2019 |
| DE | 102018123714 B3 | 12/2019 |

(Continued)

OTHER PUBLICATIONS

Long, Xun, et al. "Online monitoring of substation grounding grid conditions using touch and step voltage sensors." IEEE transactions on smart grid 3.2 (2012): 761-769. (Year: 2012).*

(Continued)

*Primary Examiner* — Ryan Johnson

(74) *Attorney, Agent, or Firm* — George Likourezos; Carter, DeLuca & Farrell LLP

(57) ABSTRACT

The invention relates to a mobile electric energy supply device, comprising
- at least one energy supply connector for drawing energy from the energy supply device,
- a ground grounding device adapted to cooperate with a ground of the installation site of the energy supply device to provide grounding for the energy supply device, and
- a touch safety monitoring device adapted to monitor at least one touch point disposed on or electrically connected to the energy supply device for touch safety.

15 Claims, 3 Drawing Sheets

(56) References Cited

FOREIGN PATENT DOCUMENTS

Figure 1:
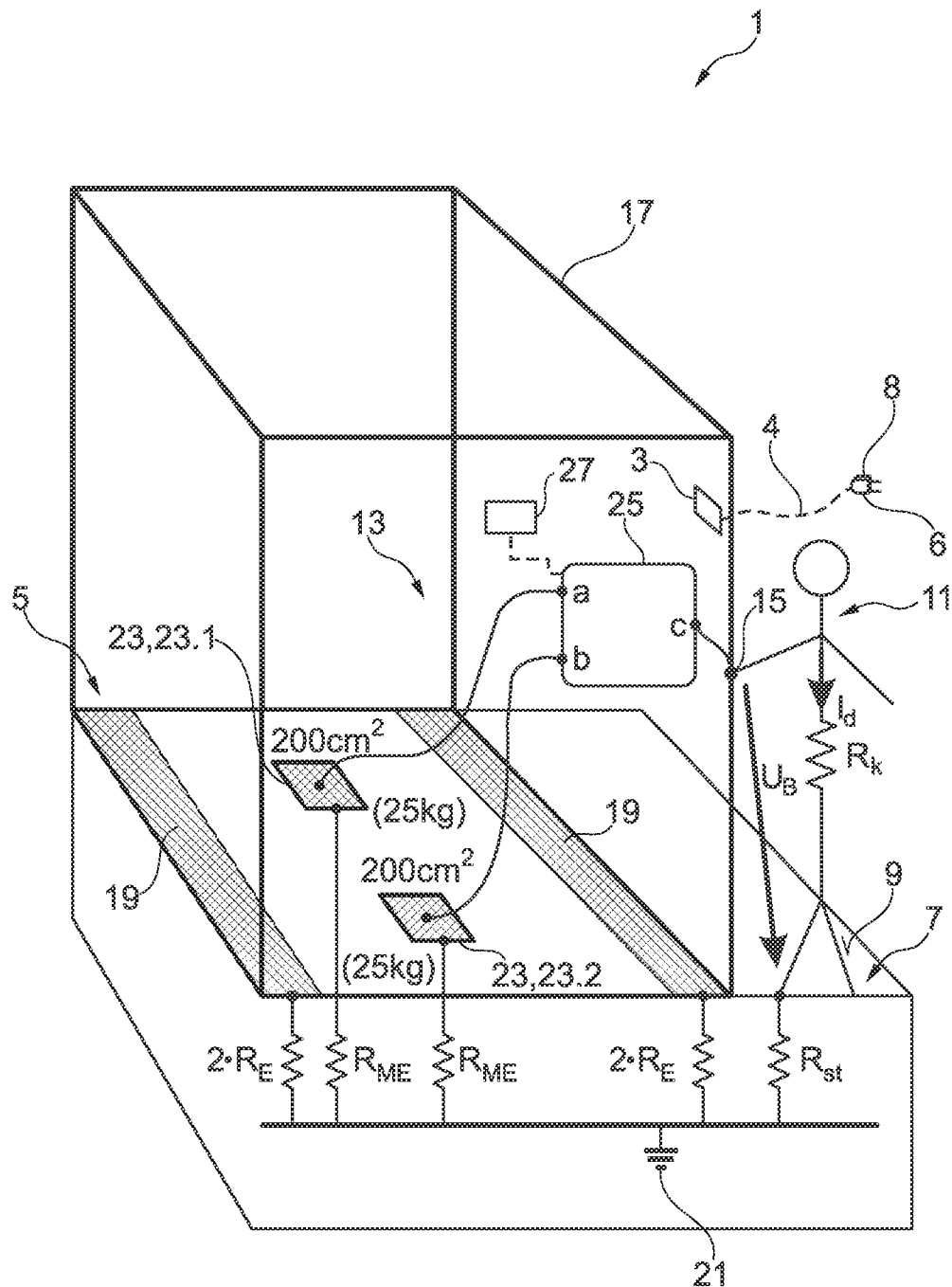

DE  102018129413 A1  5/2020
WO  2019/072569 A1  4/2019

OTHER PUBLICATIONS

Enns, Guillaume, and Devriendt. "Mobile substations: application, engineering and structural dynamics." 2005/2006 IEEE/PES Transmission and Distribution Conference and Exhibition. IEEE, 2006. (Year: 2006).*

European Search Report issued by the European Patent Office on Dec. 21, 2022, in corresponding EP Patent Application No. 22187926.5.

* cited by examiner

MOBILE ELECTRIC ENERGY SUPPLY DEVICE

CROSS REFERENCE TO RELATED APPLICATIONS

This application claims the benefit of and priority to German Patent Application No. 102021120050.4, filed Aug. 2, 2021, the entire content of which is incorporated herein by reference.

The invention relates to a mobile electric energy supply device.

Such mobile electric energy supply devices are intended to provide electric energy, in particular for consumers, even at locations where there is no or only limited access to an electric power supply network. For example, with increasing electrification of road transport, there will be a need to provide parking spaces with charging infrastructure for electric vehicles at events or functions that are only temporary, such as fairs, festivals, or at construction sites or the like, where the charging infrastructure can be provided at short notice and then removed again. In such cases, mobile electric energy supply devices can be set up, exchanged as needed, and removed again after the event. The problem here is that at a large number of possible installation sites for such energy supply devices, there is no possibility of ensuring grounding via a main grounding rail, a foundation grounding electrode, a depth grounding electrode or the like. Nevertheless, it must be ensured that contact with areas of the energy supply device accessible to users is possible at all times without risk.

The invention is therefore based on the task of creating a mobile electric energy supply device in which the disadvantages mentioned are at least reduced, and preferably do not occur.

The task is solved by providing the present technical teaching, in particular the teaching of the independent claims as well as the embodiments disclosed in the dependent claims and the description.

In particular, the task is solved by providing a mobile electric energy supply device comprising at least one energy supply connector for drawing energy from the energy supply device and a grounding device, wherein the grounding device is adapted to cooperate with a ground of the installation site at an installation site of the energy supply device to provide a grounding for the energy supply device. The energy supply device further comprises a touch safety monitoring device adapted to monitor at least one touch point disposed on or electrically connected to the energy supply device for touch safety. By means of the touch safety monitoring device, touch safety of the at least one touch point can advantageously be permanently ensured so that users of the energy supply device are not exposed to any risk of suffering damage due to excessive electrical voltages and/or currents. The energy supply device can thus advantageously also be set up and operated at installation sites which do not offer the possibility of providing an earth fault or equipotential bonding via a main grounding rail, a foundation earth electrode, a depth earth electrode or the like.

In the context of the present technical teaching, a mobile electric energy supply device is understood to mean in particular a device which is adapted to provide electric energy, in particular for a consumer, and which is also designed to be mobile, that is to say in particular transportable. In particular, the mobile electric energy supply device is arranged to be loaded and transported on a truck, in particular on a loading platform of a van. However, there is no fundamental size limitation for the energy supply device as long as its transportability is fundamentally guaranteed. It is therefore also conceivable that the energy supply device—quasi at one end of the size scale—can be transported by way of a special transport with a special permit, or that it—quasi at the other end of the size scale—can be transported in a passenger car. In a preferred embodiment, the energy supply device is dimensioned so that exactly six copies of the energy supply device can be transported on a loading area of a truck with a permissible total weight of 7.5 tons. In an embodiment, the energy staging device has a height of from 2200 mm to 2600 mm, preferably from 2280 mm to 2520 mm, preferably 2400 mm, a width of from 1000 mm to 1400 mm, preferably from 1140 mm to 1260 mm, preferably 1200 mm, and a depth of from 1300 mm to 1700 mm, preferably from 1425 mm to 1575 mm, preferably 1500 mm.

In particular, the energy supply device is arranged to be merely parked or placed at the installation site, in particular not being electrically connected to a supply network, a main grounding rail, a foundation earth electrode, a depth earth electrode or the like. In particular, the energy supply device is designed as a flying structure. This does not prevent the energy supply device from being secured mechanically—in particular against theft or elemental events or the like—at the installation site, if necessary, for example by means of ground nails or the like.

In an embodiment, the mobile electric energy supply device is adapted to provide an electric power of from 2 kW to 1 MW, preferably from 3.7 kW to 500 kW, preferably from 11 kW to 350 kW, preferably from 20 kW to 250 kW, preferably from 22 kW to 150 kW, preferably from 43 kW to 100 kW, preferably 100 kW.

Alternatively or additionally, the mobile electric energy supply device is preferably adapted to provide an electric energy of from 20 kWh to 1 MWh, preferably from 30 kWh to 500 kWh, preferably from 40 kWh to 200 kWh, preferably from 50 kWh to 100 kWh, preferably from 60 kWh to 90 kWh, preferably from 70 Wh to 80 kWh.

In the context of the present technical teachings, an energy supply connector is understood to be an electrical connector that is adapted to establish an electrical connection between the energy supply device and another electrical device, in particular a load, for example a battery, an electrical circuit or an electrical machine, so that electrical energy from the energy supply device can be supplied to the electrical device via the electrical connection. The energy supply connector can be formed in particular as a junction box, as a charging cable, in particular with a charging plug connected, or in another suitable manner.

In the context of the present technical teachings, an installation site is understood to mean, in particular, a geographical location at which the energy supply device is set up, in particular for the purpose of using it to provide electrical energy. By a ground of the installation site is understood in particular a surface area at the installation site on which the energy supply device stands due to gravity, wherein the energy supply device is preferably in direct touching contact with the ground when it is installed on the ground at the installation site.

In the context of the present technical teachings, a touch point is understood to mean in particular a point accessible to a user of the electrical energy supply device or a third party, which is electrically conductively, in particular galvanically, connected to the energy supply device or is arranged on the energy supply device itself, in particular a point from which it cannot be categorically excluded that a user or a third party comes into touching contact therewith. The touch point can be arranged on the energy supply device itself, in particular on a housing of the energy supply device, but it can in particular also be arranged on a device electrically conductively connected to the energy supply device, for example a motor vehicle electrically connected to the energy supply device.

In the context of the present technical teachings, touch safety is understood to mean, in particular, that the touch point can be touched by the user without the risk of the user being impaired or harmed by an excessively high voltage and/or current.

Wherever the present text refers to a voltage or a current or a current intensity, an electrical voltage or an electrical current or an electrical current intensity is always meant, unless expressly stated otherwise.

In particular, the touch safety monitoring device is adapted to evaluate the touch safety, in particular to determine whether the touch safety is given or whether the touch safety is not given.

In an embodiment of the power supply device, the touch safety monitoring device is adapted to take at least one measure when it is determined that touch safety is not given. The at least one measure is preferably selected from a group consisting of: A shutdown of the power supply device, in particular a power electronics of the energy supply device, a triggering of a hardware fault, and an opening of a main switch of the power supply device, in particular a main switch of the power electronics. If a hardware fault is triggered, this preferably also leads to the energy supply device being switched off and/or to the main switch being opened.

According to a further development of the invention, it is provided that the ground grounding device comprises at least one grounding floor space which is arranged and adapted to be in touching contact with the ground at the installation site, in particular to stand up on the ground. Via the grounding floor space, potential equalization to the ground is advantageously provided. In particular, the at least one grounding floor space is arranged and adapted in such a way that the energy supply device with the at least one grounding floor space stands on the ground at the installation site.

In an embodiment, the grounding floor space is arranged on a grounding plate, in particular an electrically conductive plate, in particular a metal plate, or it is formed as a grounding plate, in particular an electrically conductive plate, in particular a metal plate.

In an embodiment of the energy supply device, the at least one grounding floor space has an area of 1000 $cm^2$ to 5000 $cm^2$, preferably 2000 $cm^2$ to 4000 $cm^2$. Preferably, the ground grounding device has a plurality of grounding floor spaces, wherein the grounding floor spaces have a total area of 3000 $cm^2$ to 6000 $cm^2$, preferably 4000 $cm^2$. If the ground grounding device has a plurality of grounding floor spaces, these are preferably arranged in such a way that the energy supply device stands on the ground of the installation site with at least two grounding floor spaces of the plurality of grounding floor spaces, preferably with all grounding floor spaces.

In an embodiment of the energy supply device, the ground grounding device has exactly two grounding floor spaces, wherein each grounding floor space of the two grounding floor spaces has an area of about 2000 $cm^2$, in particular 1900 $cm^2$ to 2100 $cm^2$, preferably 2000 $cm^2$, so that the two grounding floor spaces have a total area of about 4000 $cm^2$, in particular 3800 $cm^2$ to 4200 $cm^2$, preferably 4000 $cm^2$.

According to a further development of the invention, it is provided that the touch safety monitoring device comprises at least one contact plate which is arranged and adapted to be in touching contact with the ground at the installation site. By means of the at least one contact plate, in particular an electrical connection of a user to the ground of the installation site can advantageously be simulated. In particular, the at least one contact plate is provided in addition to the at least one grounding floor space. In particular, the at least one contact plate is arranged spaced apart from the grounding floor space so that the contact plate does not touch the grounding floor space. In particular, the at least one contact plate is arranged in a bottom region of the energy supply device.

In an embodiment, the at least one contact plate has an area of 100 $cm^2$ to 500 $cm^2$, preferably 200 $cm^2$ to 400 $cm^2$. Preferably, the touch safety monitoring device has a plurality of contact plates, wherein the contact plates have a total area of 300 $cm^2$ to 600 $cm^2$, preferably 400 $cm^2$. Where the touch safety monitoring device has a plurality of contact plates, the contact plates are preferably arranged such that the energy delivery device has at least two contact plates of the plurality of contact plates, preferably all of the contact plates, in contacting engagement with the ground at the installation site when the energy delivery device is installed at the installation site.

The at least one contact plate is preferably arranged and adapted in such a way that it is urged against the ground with a—in particular predetermined—force of 200 N to 300 N, preferably 250 N, when the energy supply device is set up at the installation site. In an embodiment of the energy supply device, the at least one contact plate is actively or passively preloaded, for example by means of a spring and/or by an actuator, in order to ensure that it is urged against the ground with the predetermined force, in particular irrespective of the specific nature of the ground at the installation site. Alternatively or additionally, the at least one contact plate has a mass of 20 kg to 30 kg, preferably 25 kg.

The at least one contact plate preferably replicates human feet of a user of the energy supply device at the installation site, so that the touch safety of a user can be monitored by means of the touch safety monitoring device at the installation site under realistic conditions.

In an embodiment of the energy supply device, the touch safety monitoring device comprises a measuring device that is at one end operatively connected to the at least one contact plate and at the other end operatively connected to the at least one touch point. In particular, the measuring device is electrically connected on the one hand to the at least one contact plate and on the other hand to the at least one touch point. In particular in this way, an electrical connection of the touch point to the ground via a user can be advantageously simulated by means of the contact plate, wherein the measuring device allows the touch safety, in particular occurring currents and/or voltages, to be detected and preferably evaluated.

According to a further development of the invention, it is provided that the measuring device is adapted to measure at least one electrical measurand between the at least one touch point and the at least one contact plate, wherein the at least one electrical measurand is selected from a group consisting of a voltage and a current. In particular in this way, the touch reliability can be advantageously evaluated—quasi vicariously for a user, i.e. as it were as a proxy measurement—via the relevant electrical quantities occurring between the at least one touch point and the at least one contact plate.

In an embodiment of the energy supply device, the measuring device is adapted to measure only the voltage as electrical measurand. In another embodiment of the energy supply device, the measuring device is adapted to measure only the current as electrical measurand. In yet another embodiment of the energy supply device, the measuring device is adapted to measure both the voltage and the current as electrical measurands; this may involve redundancy, but the different electrical measurands advantageously allow the measurements to be plausible against each other.

In an embodiment of the energy supply device, the measuring device is adapted to passively measure the at least one electrical measurand. In another embodiment of the energy supply device, the measuring device is adapted to actively measure the at least one electrical measurand, in particular by impressing a signal, in particular an alternating current signal (AC signal).

In an embodiment of the energy supply device, the measuring device is adapted to measure the at least one electrical measurand as a direct current (DC) quantity. In another embodiment of the energy supply device, the measuring device is adapted to measure the at least one electrical measurand as an alternating current (AC) signal. In another embodiment of the energy supply device, the measuring device is adapted to measure as the at least one electrical measurand a first electrical measurand as a DC quantity and a second electrical measurand as an AC quantity. In another embodiment of the energy supply device, the measuring device is adapted to detect the at least one electrical measurand as a direct current quantity and as an alternating current quantity, in particular as a combination of a direct current quantity and an alternating current quantity.

According to a further embodiment of the invention, it is adapted to provide that the touch safety monitoring device is adapted to compare a measured value of the at least one electrical measurand to a threshold value, and to evaluate the touch safety on the basis of the comparison. The threshold value is thereby preferably advantageously selected such that the touch safety is given if the measured value of the at least one electrical measurand falls below the threshold value. In particular, the threshold value can be a limit voltage or a limit current.

Preferably, a separate threshold value is specified for each electrical measurand, in particular for the voltage and for the current. Thus, at least one threshold value is provided in particular, preferably a separate threshold value for each electrical measurand.

In an embodiment of the energy supply device, it is provided that the at least one threshold value is fixed.

In another embodiment of the energy supply device, it is provided that the touch safety monitoring device is adapted to select, in particular to vary, the at least one threshold value in dependence on at least one installation parameter, wherein the at least one installation parameter is preferably selected from a group consisting of: An impedance or an electrical resistance of the ground at the installation site, a chemical composition of the ground, a physical nature of the ground, a moisture or a water content of the ground, and a ground flatness at the installation site. The impedance or electrical resistance of the ground directly affects the touch safety and thus an appropriate choice of at least one threshold value. They are also amenable to simple measurement. The other installation parameters directly influence the impedance or electrical resistance of the ground or of a transition between the energy supply device, specifically the at least one grounding floor space, and the ground. In particular, the ground flatness influences the actual contacting contact area between the at least one grounding floor space and the ground, and thus directly influences the contact resistance. The at least one installation parameter may, for example, be entered by a person setting up the energy supply device at the installation site and used to determine the at least one threshold value in the touch safety monitoring device, or it may be downloaded from a database or cloud, preferably online, particularly preferably in real time. Alternatively or additionally, it is possible that the at least one installation parameter is determined by the energy supply device, in particular the measuring device.

In an embodiment of the energy supply device, the touch safety monitoring device is adapted to vary the at least one threshold value in time depending on the at least one installation parameter, preferably continuously, or at predetermined time intervals, or event-driven, for example due to onset of rain or due to a dry period exceeding a predetermined time duration.

Preferably, a threshold value designed as a limit current is varied in dependence on the at least one installation parameter. In contrast, a threshold value designed as a limit voltage is preferably kept constant—independent of the at least one installation parameter. In particular, a voltage limit value for the contact voltage is normatively defined, while a still tolerable current depends on the concretely existing conditions and in particular on the at least one installation parameter.

According to a further development of the invention, it is adapted to provide that the measuring device is adapted to detect the at least one electrical measurand in a time-dependent manner, i. e. as a function of time, in particular as a signal, in particular as a time-variable signal, in particular as a combination of an AC signal and a DC signal (mixed AC and DC signal), or as an AC signal, or as a time-varying DC signal. The touch safety monitoring device is adapted to evaluate the touch safety based on the at least one time dependent electrical measurand. In this way, the touch safety can advantageously be evaluated particularly precisely, and it is also possible to detect a time-dependent change in the touch safety. Preferably, the touch safety monitoring device is adapted to evaluate the time-dependent detected electrical measurand, in particular to perform a signal evaluation, and to evaluate the touch safety on the basis of the evaluated electrical measurand, in particular on the basis of the signal evaluation. For example, it is possible for the time-dependent acquired electrical measurand to be subjected to filtering, in particular low-pass filtering, in order to make the evaluation of the touch safety insensitive to short-term fluctuations in the electrical measurand.

In an embodiment of the energy supply device, the touch safety monitoring device has, in addition to the measuring device, a computing device which is operatively connected to the measuring device—in particular in a data-transmitting or signal-transmitting manner—and which is adapted to evaluate the touch safety as a function of the at least one electrical measurand acquired by the measuring device, in particular to carry out the comparison with the at least one threshold value and/or to carry out the evaluation of the touch safety on the basis of the at least one electrical measurand acquired as time-dependent, in particular by means of signal evaluation. In this context, the computing device can in particular also be a control device provided incidentally for the operation of the energy supply device.

According to a further development of the invention, it is provided that the touch safety monitoring device has as the at least one contact plate two, in particular exactly two, contact plates which are spaced apart from one another— and in particular from the at least one grounding floor space—and are adapted to be in touching contact with the ground at the installation site.

In an embodiment, each contact plate of the exactly two contact plates has an area of about 200 cm$^2$, in particular from 190 cm$^2$ to 210 cm$^2$, preferably 200 cm$^2$, so that the two contact plates have a total area of about 400 cm$^2$, in particular from 380 cm$^2$ to 420 cm$^2$, preferably 400 cm$^2$.

In particular, with an area of 200 cm$^2$ each, a total area of 400 cm$^2$, and a force of 250 N each, i.e. 500 N in total, with which the two contact plates are urged against the ground, the contact plates mimic human feet of a user of the energy supply device at the installation site, so that the touch safety of a user can be monitored by means of the touch safety monitoring device at the installation site under realistic conditions.

In an embodiment of the energy supply device, the two contact plates are electrically connected to the measuring device in parallel with each other. Also in this respect, the design of the contact plates is consistent with the characteristics of human feet.

According to a further embodiment of the invention, it is provided that the measuring device is operatively connected, that is, in particular electrically connected, to the two contact plates and is adapted to measure an impedance between the contact plates. In particular via the impedance between the contact plates, it is possible to obtain information about the at least one installation parameter and to derive at least one suitable threshold value therefrom, so that contact safety is ensured—in particular at all times.

In an embodiment of the energy supply device, the measuring device is adapted to passively measure the impedance between the contact plates. In another embodiment of the energy supply device, the measuring device is adapted to actively measure the impedance between the contact plates, in particular by imposing a signal, in particular an alternating current signal (AC signal).

In an embodiment of the energy supply device, the measuring device is adapted to measure the impedance between the contact plates as a DC resistance or ohmic resistance. In another embodiment of the energy supply device, the measuring device is adapted to measure the impedance between the contact plates as an AC resistance, that is, as an impedance in the narrower sense.

According to a further development of the invention, it is provided that the energy supply device is designed as a device selected from a group consisting of an electrical energy storage, a charging station, in particular for charging electrically driven motor vehicles, and an electronic power converter. In particular, the electronic power converter may be an inverter, rectifier, boost converter, or buck converter. In particular, the electronic power converter may be arranged for use with a photovoltaic device, which may advantageously be arranged in particular at the same installation site as the energy supply device or even mechanically connected to the energy supply device, for example arranged on a roof area of the energy supply device, in particular to harvest and provide energy locally. In addition to the applications described at the outset, the energy supply device can also be set up in particular to provide energy at a construction site, for example, in particular for construction machines. Of course, the energy supply device can also be used for other applications or be specifically set up.

In accordance with a further development of the invention, it is provided that the energy supply connector comprises a charging cable comprising a protective conductor, wherein the touch safety monitoring device, in particular the measuring device, is electrically connected to the protective conductor. In particular, in such a case, the touch safety monitoring device is also adapted to monitor a touch point outside the energy supply device, for example on a device electrically connected thereto, for example an electric motor vehicle.

In an embodiment, the energy supply device has a plurality of energy supply connectors, in particular a plurality of charging cables. It is then advantageously possible to connect a plurality of other electrically connected devices, in particular motor vehicles, to the energy supply device simultaneously.

According to a further development of the invention, it is provided that the measuring device comprises a common contact point as well as a measuring circuit. A first contact plate of the two contact plates is electrically connected to the common contact point via a first connection conductor. A second contact plate of the two contact plates is electrically connected to the common contact point via a second connection conductor. The measuring circuit is electrically connected to the at least one touch point and to the common contact point, and is adapted to measure the at least one electrical measurand between the at least one touch point and the common contact point. In particular, the measuring circuit has a first terminal electrically connected to a first contact plate of the two contact plates, a second terminal electrically connected to a second contact plate of the two contact plates, and a third terminal electrically connected to the at least one touch point. The first terminal and the second terminal are electrically connected to each other in the common contact point, and the measuring circuit is adapted to measure the at least one electrical measurand between the third terminal and the common contact point. The common contact point need not be formed as a spatially-geometrically identifiable point. Rather, it is sufficient if the first terminal and the second terminal, or the first connection conductor and the second connection conductor, are electrically connected to one another, the measuring circuit being adapted to measure the at least one electrical measurand between the touch point, on the one hand, and any point in the electrical connection between the first terminal and the second terminal, or the first connection conductor and the second connection conductor, on the other hand. Thus, the common contact point may in particular be formed as an imaginary common contact point. However, it is of course also possible for the common contact point to exist in a spatially-geometrically identifiable manner, for example as a solder joint or the like.

According to a further development of the invention, it is adapted to provide that the measuring device is adapted to measure the impedance between the two contact plates, in particular between the first connection conductor and the second connection conductor, or correspondingly between the first terminal and the second terminal. A first decoupling device is arranged in the first connection conductor. A second decoupling device is arranged in the second connection conductor. By means of the decoupling device, an electrical isolation can advantageously be ensured, so that not merely or substantially the impedance of the measuring circuit, but actually the impedance between the contact plates is measured and thus useful information about the at least one setup parameter is obtained.

According to a further development of the invention, it is provided that at least one decoupling device selected from the first decoupling device and the second decoupling device is formed as a decoupling resistor. This represents a particularly simple and robust embodiment of the decoupling device. If the respective decoupling resistor is known, it can be taken into account in a simple manner when determining the impedance between the contact plates.

In an embodiment of the energy supply device, at least one of the decoupling resistors, preferably the first decoupling resistor and the second decoupling resistor, respectively, is formed as an ohmic resistor. The first decoupling resistor and/or the second decoupling resistor preferably each have a resistance value of 500Ω to 1 kΩ. Preferably, the first decoupling resistor and the second decoupling resistor have the same resistance value.

In another embodiment of the energy supply device, at least one of the decoupling resistors, preferably the first decoupling resistor and the second decoupling resistor in each case, is designed as a coil, in particular a choke.

In an embodiment of the energy supply device, both the first decoupling device and the second decoupling device are each formed as a decoupling resistor.

In an alternative embodiment of the invention, it is provided that at least one decoupling device selected from the first decoupling device and the second decoupling device is formed as a switch, in particular as a controllable switch. This represents a possibility of determining the impedance with particularly high accuracy and at the same time flexibly, in particular with a possibility for plausibility checking.

In an embodiment of the energy supply device, both the first decoupling device and the second decoupling device are each designed as a switch, in particular as a controllable switch. In particular, the first decoupling device is formed as a first controllable switch, and the second decoupling device is formed as a second controllable switch. By alternately actuating the first switch and the second switch, so that in a first functional state the first switch is closed and the second switch is open, wherein in a second functional state the first switch is open and the second switch is closed, a loop impedance can be determined for each connection conductor individually, that is in particular for each contact plate individually, via the ground, the at least one grounding floor space, and the measuring device, wherein preferably an internal impedance or internal resistance of the measuring circuit is known, so that in the result relevant information about the at least one installation parameter is obtained. In this case, the two measurements performed separately for the contact plates can be checked for plausibility against each other. In a third functional state, both switches are preferably open; the impedance between the contact plates can then be determined directly. Finally, from a combination of the measurements in the first functional state, the second functional state and the third functional state, the grounding resistance in the area of at least one grounding floor space can also be obtained. Overall, this circuit can thus be used to detect multiple parasitic components with the highest precision. For the purpose of monitoring the touch resistance in the narrower sense, i.e. in particular for measuring the at least one electrical measurand between the at least one touch point and the at least one contact plate, both switches are preferably closed in a fourth functional state.

In an embodiment of the energy supply device, at least one of the switches is configured as a semiconductor switch. Preferably, both switches are designed as semiconductor switches.

According to a further embodiment of the invention, it is provided that a first measuring resistor is integrated in the measuring circuit. The measuring resistor advantageously permits simple measurement of the touch voltage, in particular as a voltage drop across the measuring resistor, and if necessary of the touch current, in particular as a current flowing through the measuring resistor. The measuring resistor preferably has a resistance value of 0.5 kΩ to 1.5 kΩ.

In an alternative embodiment of the invention, it is provided that the first contact plate is electrically connected in parallel with the first connection conductor and the measuring circuit via a second measuring resistor to the at least one touch point, the second contact plate being electrically connected in parallel with the second connection conductor and the measuring circuit via a third measuring resistor to the at least one touch point. In this case, the decoupling of the impedance measurement is advantageously effected by the measuring resistors themselves. If two measuring resistors connected in parallel to each other are provided instead of one measuring resistor, each measuring resistor of the two measuring resistors preferably has a double resistance value compared to the only one measuring resistor.

In an embodiment of the energy supply device, at least one of the measuring resistors, preferably the first measuring resistor and the second measuring resistor in each case, is designed as an ohmic resistor.

In another embodiment of the energy supply device, at least one of the measuring resistors, preferably in each case the first measuring resistor and the second measuring resistor, is designed as a coil, in particular an inductor.

According to a further development of the invention, it is provided that a first contact plate of the two contact plates is electrically connected to the at least one touch point via a first measuring conductor. A second contact plate of the two contact plates is electrically connected to the at least one touch point via a second measuring conductor. A fourth measuring resistor is arranged in the first measuring conductor. A fifth measuring resistor is arranged in the second measuring conductor. The measuring device is adapted to measure a first electrical voltage drop across the fourth measuring resistor, and to measure a second electrical voltage drop across the fifth measuring resistor. The two separate voltage measurements can advantageously be used for plausibility checking.

Figure 2:
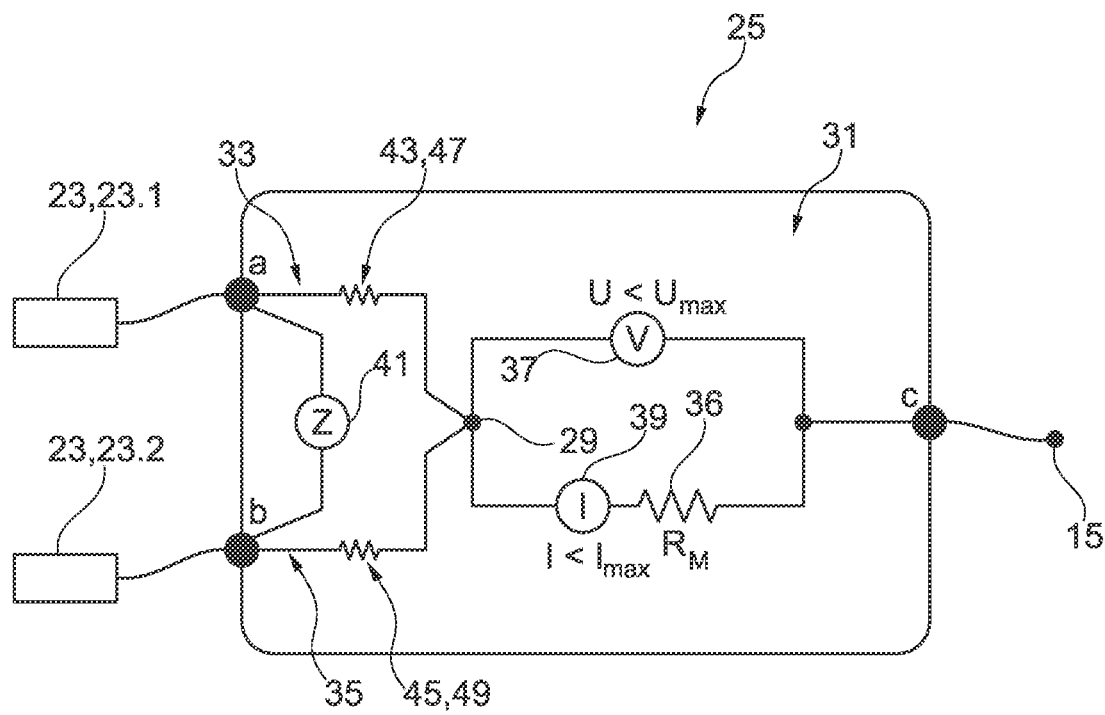
Figure 3:
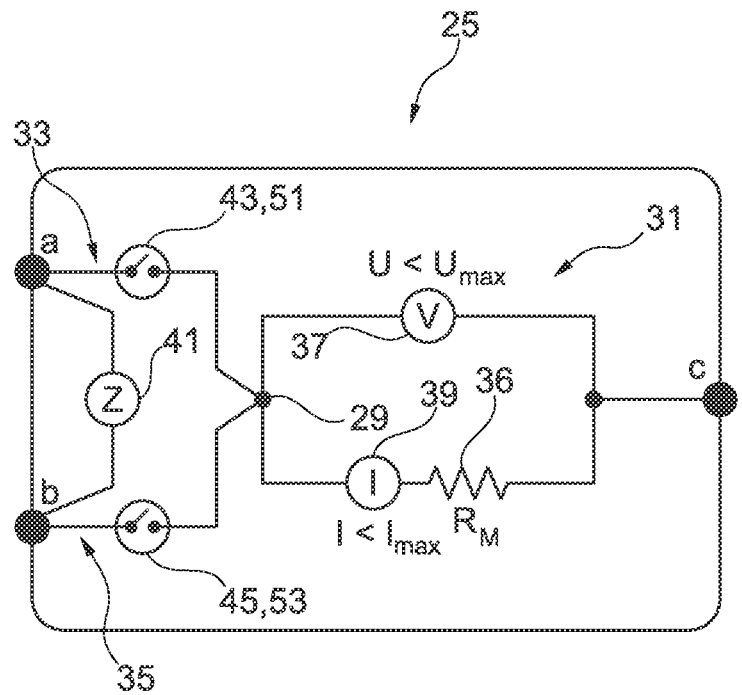
Figure 4:
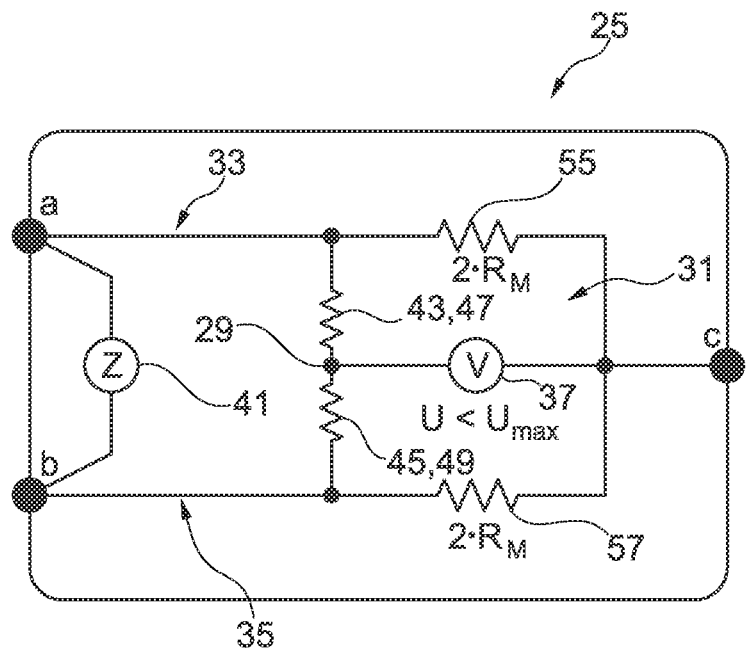
Figure 5:
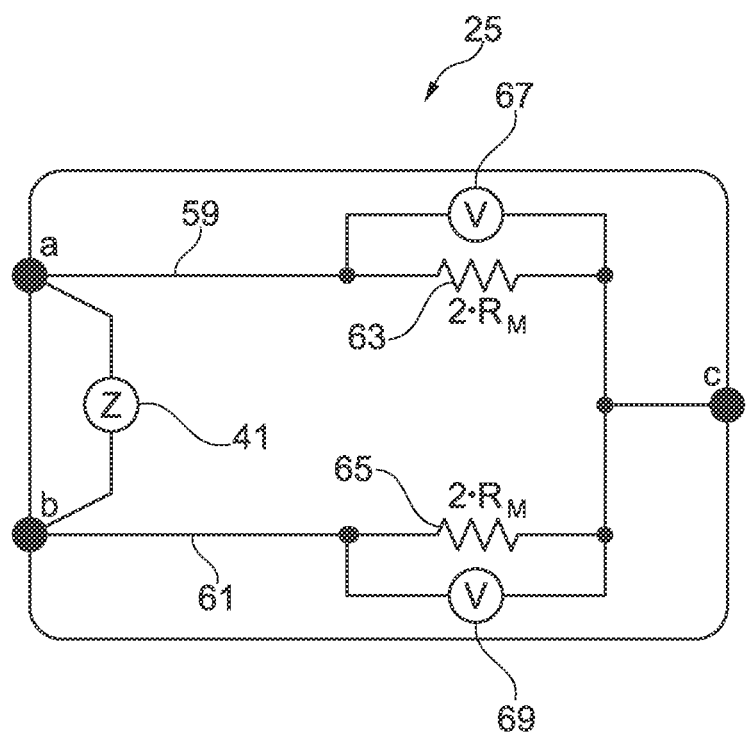

The invention is explained in more detail below with reference to the drawing. Thereby showing:

FIG. 1 a schematic illustration of an embodiment of a mobile electric energy supply device;

FIG. 2 a schematic illustration of a first embodiment of a measuring device of the energy supply device;

FIG. 3 a schematic illustration of a second embodiment of a measuring device of the energy supply device;

FIG. 4 a schematic illustration of a third embodiment of a measuring device of the energy supply device, and FIG. 5 a schematic illustration of a fourth embodiment of a measuring device of the energy supply device.

FIG. 1 shows a schematic illustration of an embodiment of a mobile electric energy supply device 1, which has at least one energy supply connector 3, indicated here only schematically, for drawing energy from the energy supply device 1. The energy supply connector 3 may be designed as a junction box or as a charging cable 4, in particular connected to a plug 6. It is possible that the energy supply device 1 has a plurality of energy supply connectors 3, for example in order to be able to charge a plurality of electric motor vehicles at the same time. The energy supply device 1 comprises a ground grounding device 5, which is adapted to cooperate with a ground 9 of the installation site 7 of the energy supply device 1 to provide a grounding for the energy supply device 1. To ensure electrical touch safety for a user 11, the energy supply device 1 comprises a touch safety monitoring device 13 adapted to monitor at least one touch point 15 disposed on or electrically connected to the energy supply device 1 for touch safety. Advantageously, this makes it possible for the user 11 to operate the energy supply device 1 without risk even at an installation site 7 where there is no possibility of a connection to a main grounding rail, a foundation grounding electrode, a depth grounding electrode or the like.

In the case illustrated here, the touch point 15 is arranged on a housing 17 of the energy supply device 1. Additionally or alternatively, it is possible that the touch point 15 is arranged on another device external to the energy supply device 1 but electrically connected to the energy supply device 1, for example an electric motor vehicle. In particular, it is possible that a charging cable of the energy supply connector 3 has a protective conductor 8, in which case the touch safety monitoring device 13 is electrically connected to the protective conductor 8.

In a manner not explicitly shown here, the energy supply device 1 has at least one electrical or electronic device for providing electrical energy, which is electrically connected to the energy supply connector 3 and is preferably arranged in the housing 17. The electrical or electronic device may in particular be in the form of a battery and/or a power converter circuit. The energy supply device 1 is preferably formed as a device selected from a group consisting of: An electrical energy storage, a charging station, in particular for charging electrically driven motor vehicles, and an electronic power converter, in particular an inverter, a rectifier, a boost converter, or a buck converter.

The ground grounding device 5 preferably has at least one grounding floor space 19, in this case in particular two grounding floor spaces 19 spaced apart from each other, wherein the at least one grounding floor space 19 is arranged and adapted to be in touching contact with the ground 9 at the installation site 7. Schematically, the grounding floor spaces 19 each have a partial grounding resistance to an imaginary grounding point 21, indicated here as $2R_E$, so that a total grounding resistance for the energy supply device 1 results due to the electrical parallel connection of the two partial grounding resistances of the grounding floor spaces 19 to $R_E$. The individual partial ground resistances $2R_E$ and thus also the total ground resistance $R_E$ depend on the specific installation conditions of the electrical energy supply device 1 at the installation site 7, in particular on at least one installation parameter, in particular on an impedance or an electrical resistance of the ground at the installation site, a chemical composition of the ground, a physical condition of the ground, a moisture or a water content of the ground, and a ground flatness at the installation site.

The touch safety monitoring device 13 has at least one contact plate 23, in this case two contact plates 23 arranged spaced apart from each other, namely a first contact plate 23.1 and a second contact plate 23.2. The contact plates 23 are arranged and adapted to be in contacting engagement with the ground 9 at the installation site 7. Each contact plate 23 of the contact plates 23 preferably has an area of 200 cm² and a mass of 25 kg, resulting in a total summed contact area of 400 cm² and a total contact force of 500 N on the ground 9 for the contact plates 23 of the touch safety monitoring device 13. In particular, in this way, the contact plates 23 replicate the contact of the feet of the human user 11 with the ground 9. The contact plates 23 each have a contact resistance, denoted $R_{ME}$, to the imaginary grounding point 21. The contact resistances of the contact plates 23 are indicated here as equal, in particular for the sake of simplicity. They may well be the same—not least depending in particular on the specific installation conditions—but it is also possible for the contact resistances of the contact plates 23 to be different from one another.

The touch safety monitoring device 13 also has a measuring device 25 which is operatively connected, that is in particular electrically connected, on the one hand to the contact plates 23 and on the other hand to the touch point 15. In particular, the contact plates 23 are electrically connected to the measuring device 25 in parallel with one another. The measuring device 25 is adapted to monitor the touch safety at the touch point 15 by measuring and preferably evaluating at least one electrical measurand.

In particular, the measuring device 25 is adapted to measure the at least one electrical measurand between the touch point 15 and the contact plates 23. The at least one electrical measurand is thereby selected from a group consisting of: A voltage and a current.

The touch safety of the user 11 is determined, on the one hand, by a touch voltage $U_B$ which drops across the body of the user 11, represented here by a body resistance $R_k$, between the touch point 15 and the ground 9, and, on the other hand, by a touch current intensity $I_d$ which flows through the body, that is, in the equivalent circuit diagram, the body resistance $R_k$ and a location resistance $R_{st}$. The feet of the user 11 are thereby electrically connected to the imaginary grounding point 21 via the location resistor $R_{st}$.

The touch voltage $U_B$ is preferably to be less than a threshold voltage of 50 V as a threshold value. The touch current $I_d$ shall preferably be smaller than a threshold current of 30 mA as threshold value. Especially if both conditions are fulfilled, the touch safety is given. In particular, the threshold values can also be chosen to be lower.

By means of the touch safety monitoring device 13, the electrical conditions are virtually simulated for the user 11, and in particular an attempt is made to estimate at least one touch safety parameter selected from the touch voltage $U_B$ and the touch current intensity $I_d$, preferably both touch safety parameters, on the basis of a suitable measurement.

The touch safety monitoring device 13, in particular the measuring device 25, is preferably adapted to compare a measured value of the at least one electrical measurand with a threshold value, in particular the threshold values specified above or derived therefrom, and to evaluate the touch safety on the basis of the comparison. The threshold value can be predetermined, in particular fixed, or variable, in particular depending on the at least one installation parameter.

Preferably, the measuring device 25 is adapted to acquire the at least one electrical measurand in a time-dependent manner, in particular as a signal. Preferably, the touch safety monitoring device 13, in particular the measuring device 25, is adapted to evaluate the touch safety on the basis of the at least one electrical measurand acquired in a time-dependent manner, in particular by means of signal evaluation.

In a preferred embodiment, the touch safety monitoring device 13 has, in addition to the measuring device 25, a computing device 27 which is operatively connected to the measuring device 25 and is adapted to evaluate the touch safety as a function of the at least one electrical measurand detected by the measuring device 25, in particular to perform the comparison with the threshold value and/or to perform the evaluation of the touch safety on the basis of the at least one electrical measurand detected as a function of time, in particular by means of signal evaluation.

The measuring device 25 is preferably adapted to measure an impedance between the two contact plates 23, in particular to obtain information therefrom about the at least one installation parameter and thus at least indirectly about the contact resistances $R_{ME}$, the total earth resistance $R_E$, and thus ultimately also the site resistance $R_{st}$.

FIG. 2 shows a schematic illustration of a first embodiment of the measuring device 25 of the energy supply device 1.

Identical and functionally identical elements are provided with the same reference numerals in all figures, so that reference is made in each case to the preceding description.

The measuring device 25 has a common contact point 29 and a measuring circuit 31. The first contact plate 23.1 is electrically connected to the common contact point 29 via a first connection conductor 33. The second contact plate 23.2 is electrically connected to the common contact point 29 via a second connection conductor 35. The measuring circuit 31 is electrically connected to the at least one touch point 15 and to the common contact point 29, and is adapted to measure the at least one electrical measurand between the touch point 15 and the common contact point 29. In particular, the measuring device 25 comprises a first terminal a electrically connected to the first contact plate 23.1, a second terminal b electrically connected to the second contact plate 23.2, and a third terminal c electrically connected to the touch point 15, the measuring circuit 31 being adapted to measure the at least one electrical measurand between the third terminal c and the common contact point 29.

In particular, the measuring circuit 31 comprises a measuring resistor 36 having the resistance value $R_M$ and a voltage measuring device 37, in particular a voltmeter, which is arranged and adapted to measure a voltage U dropping across the measuring resistor 36. Preferably, the measuring circuit 31 further comprises a current measuring device 39, in particular an amperemeter, which is adapted to measure a current I flowing through the measuring resistor 36. The measuring device 25 or the computing device 27 is preferably adapted to compare the voltage U with a limit voltage $U_{max}$, and/or to compare the current I with a limit current $I_{max}$, and to evaluate the touch safety based on the comparison.

The measuring device 25 is further preferably adapted to measure an impedance Z between the contact plates 23, in particular between the first connection conductor 33 and the second connection conductor 35. For this purpose, the measuring device 25 preferably comprises an impedance measuring device 41 arranged and adapted to measure the impedance Z.

Preferably, a first decoupling device 43 is arranged in the first connection conductor 33, and a second decoupling device 45 is arranged in the second connection conductor 35. The decoupling devices 43, 45 advantageously ensure that by means of the impedance measuring device 41 the impedance Z between the contact plates 23 is actually measured and not, for example, a short circuit or an internal impedance of the measuring circuit 31.

In the first embodiment of the measuring device 25 according to FIG. 2, the decoupling devices 43, 45 are each formed as decoupling resistors 47, 49.

FIG. 3 shows a schematic illustration of a second embodiment of the measuring device 25. In this second embodiment, the decoupling devices 43, 45 are each designed as, in particular, controllable switches 51, 53. In particular, the first decoupling device 43 is formed as a first controllable switch 51, and the second decoupling device 45 is formed as a second controllable switch 53. Preferably, the first switch 51 and the second switch 53 are alternately controlled, in particular by the computing device 27. In a first functional state, the first switch 51 is closed, and the second switch 53 is open. In a second functional state, the first switch 51 is open, and the second switch 53 is closed. In this way, a loop impedance can be determined individually for each contact plate 23 via the ground 9, the grounding floor spaces 19, and the measuring circuit 31, with an internal impedance or an internal resistance of the measuring circuit 31 preferably being known, so that ultimately the sum of the total grounding impedance and the respective contact resistance $R_E + R_{ME}$ is determined and relevant information about the at least one installation parameter is obtained as a result. In this case, the two measurements performed separately for the contact plates 23 in each case can be checked for plausibility against each other. In a third functional state, both switches 51, 53 are preferably open; the impedance between the contact plates can then be determined directly, in particular as $2R_{ME}$. Finally, from a combination of the measurements in the first functional state, the second functional state and the third functional state, the contact resistance $R_{ME}$ and the total ground resistance $R_E$ alone can also be obtained. Thus, overall, in this second embodiment of the measuring device 25, multiple parasitic components can be detected with the highest precision. For the purpose of monitoring the touch safety in the narrower sense, i.e. in particular for measuring the at least one electrical measurand between the touch point 15 and the contact plates 23, preferably in a fourth functional state both switches 51, 53 are closed.

Preferably, the switches 51, 53 are designed as semiconductor switches.

FIG. 4 shows a schematic illustration of a third embodiment of the measuring device 25.

In the first embodiment example according to FIG. 2 and the second embodiment example according to FIG. 3 of the measuring device 25, the measuring resistor 36, which is referred to as a first measuring resistor 36 for the purpose of differentiation, is virtually integrated in the measuring circuit 31.

In contrast, in the third embodiment example of the measuring device 25 according to FIG. 4, the first contact plate 23.1, that is to say here in particular the first terminal a, is electrically connected in parallel with the first connection conductor 33 and with the measuring circuit 31 via a second measuring resistor 55 to the touch point 15, that is to say in particular to the third terminal c, and the second contact plate 23.2, that is to say in particular the second terminal b, is electrically connected in parallel with the second connection conductor 35 and the measuring circuit 31 via a third measuring resistor 57 to the touch point 15, that is to say in particular to the third terminal c. Due to the electrical parallel connection of the second measuring resistor 55 and the third measuring resistor 57, these preferably each have twice the resistance value $2R_M$ compared to the first measuring resistor 36.

The decoupling devices 43, 45 are shown here by way of example—analogous to the first embodiment according to FIG. 2—as decoupling resistors 47, 49. However, it is of course also possible in the third embodiment example to design the decoupling devices 43, 45 as coils, in particular chokes.

Compared to the first embodiment example according to FIG. 2, the third embodiment example according to FIG. 4 has the advantage that, on the one hand, the decoupling resistors 47, 49 can be designed with a high impedance, whereby the measuring resistors 55, 57 according to FIG. 4 also have higher resistance values than the decoupling resistors 47, 49 of the first embodiment example shown in FIG. 2. Thus, the impedance between the contact plates 23 can be measured with higher accuracy in the third embodiment example according to FIG. 4 than in the first embodiment example according to FIG. 2. In the latter, the decoupling resistors 47, 49 should be selected much smaller than the first measuring resistor 36 in order not to influence the measurement of the at least one electrical measurand too much, but this in turn has the consequence that the impedance between the contact plates 23 can only be determined with comparatively low accuracy, since the measurement is dominated by the decoupling resistors 47, 49 connected in parallel.

FIG. 5 shows a schematic illustration of a fourth embodiment of the measuring device 25. In the fourth embodiment, the first terminal a and thus the first contact plate 23.1 is connected to the third terminal c and thus the touch point 15 via a first measuring conductor 59, and the second terminal b and thus the second contact plate 23.2 is electrically connected to the third terminal c and thus the touch point 15 via a second measuring conductor 61. A fourth measuring resistor 62 is arranged in the first measuring conductor 59, and a fifth measuring resistor 65 is arranged in the second measuring conductor 61. In this case, the measuring device 25 comprises two voltage measuring devices, referred to as second voltage measuring device 67 and third voltage measuring device 69 in distinction to the single—first—voltage measuring device 37 of the preceding embodiments, wherein the second voltage measuring device 67 is adapted to measure an electrical voltage drop across the fourth measuring resistor 63, and wherein the third voltage measuring device 69 is adapted to measure a second electrical voltage drop across the fifth measuring resistor 65. Due to the electrical parallel connection of the fourth measuring resistor 63 and the fifth measuring resistor 65, they in turn have twice the resistance value $2R_M$ compared to the single first measuring resistor 36. The decoupling of the impedance measurement with the impedance measuring device 41 takes place here directly via the measuring resistors 63, 65 themselves. In this way, too, a more precise measurement of the impedance is advantageously possible than in the first embodiment example according to FIG. 2. The double voltage measurement via the second voltage measuring device 67 and the third voltage measuring device 69 advantageously enables a plausibility check of the measured values against each other.

The invention claimed is:

1. A mobile electric energy supply device, comprising:
   at least one energy supply connector for drawing energy from the energy supply device,
   a ground grounding device adapted to cooperate at an installation site with a ground of the installation site of the energy supply device to provide grounding for the energy supply device, and
   a touch safety monitoring device adapted to monitor at least one touch point disposed on or electrically connected to the energy supply device for touch safety,
   wherein the touch safety monitoring device comprises at least one contact plate arranged and adapted to be in touching contact with the ground at the installation site, wherein the touch safety monitoring device comprises a measuring device which is operatively connected to the at least one contact plate on the one hand and to the at least one touch point on the other hand,
   wherein the touch safety monitoring device comprises as the at least one contact plate two contact plates which are spaced apart from each other and are adapted to be in touching contact with the ground at the installation site, wherein the two contact plates are electrically connected in parallel with each other to the measuring device, and
   wherein the measuring device is operatively connected to the two contact plates and adapted to measure an impedance between the contact plates, while the measuring device is operatively connected to the at least one touch point.

2. The mobile energy supply device according to claim 1, wherein the ground grounding device comprises at least one grounding floor space arranged and adapted to be in touching contact with the ground at the installation site.

3. The mobile energy supply device according to claim 1, wherein the measuring device is adapted to measure at least one electrical measurand between the at least one touch point and the at least one contact plate, wherein the at least one electrical measurand is selected from a group, consisting of a voltage and a current.

4. The mobile energy supply device according to claim 3, wherein the touch safety monitoring device is adapted to compare a measured value of the at least one electrical measurand to a threshold value, and to evaluate the touch safety based on the comparison.

5. The mobile energy supply device according to claim 3, wherein the measuring device is adapted to detect the at least one electrical measurand as time dependent, and wherein the touch safety monitoring device is adapted to evaluate the touch safety on the basis of the at least one electrical measurand detected as time dependent.

6. The mobile energy supply device according to claim 1, wherein the energy supply device is formed as a device selected from a group consisting of: An electrical energy storage, a charging station, in particular for charging electrically driven motor vehicles, and an electronic power converter.

7. The mobile energy supply device according to claim 1, wherein the touch safety monitoring device comprises a measuring device which has a common contact point and a measuring circuit, wherein a first contact plate of two contact plates is electrically connected to a common contact point via a first connection conductor, wherein a second contact plate of the two contact plates is electrically connected to the common contact point via a second connection conductor, and wherein the measuring circuit is electrically connected to at least one touch point and to the common contact point and is adapted to measure at least one electrical measurand between the at least one touch point and the common contact point.

8. The mobile energy supply device according to claim 7, wherein the measuring device is adapted to measure the impedance between the two contact plates, in particular between the first connection conductor and the second connection conductor, wherein a first decoupling device is arranged in the first connection conductor, and wherein a second decoupling device is arranged in the second connection conductor.

9. The mobile energy supply device according to claim 8, wherein at least one decoupling device selected from said first decoupling device and said second decoupling device is formed as a
   decoupling resistor, or
   switch.

10. The mobile energy supply device according to claim 7, wherein
   a first measuring resistor is integrated in the measuring circuit, or wherein
   the first contact plate is electrically connected in parallel with the first connection conductor and the measuring circuit via a second measuring resistor to the at least one touch point, wherein the second contact plate is electrically connected in parallel with the second connection conductor and the measuring circuit via a third measuring resistor to the at least one touch point.

11. The mobile energy supply device according to claim 7, wherein a first contact plate of the two contact plates is electrically connected to the at least one touch point via a first measuring conductor, wherein a second contact plate of the two contact plates is electrically connected to the at least one touch point via a second measuring conductor, a fourth measuring resistor being arranged in the first measuring conductor, a fifth measuring resistor being arranged in the second measuring conductor, and the measuring device being adapted to measure a first electrical voltage drop across the fourth measuring resistor and to measure a second electrical voltage drop across the fifth measuring resistor.

12. A mobile electric energy supply device, comprising:
   at least one energy supply connector for drawing energy from the energy supply device,
   a ground grounding device adapted to cooperate at an installation site with a ground of the installation site of the energy supply device to provide grounding for the energy supply device, and
   a touch safety monitoring device adapted to monitor at least one touch point disposed on or electrically connected to the energy supply device for touch safety,
   wherein the touch safety monitoring device comprises at least one contact plate arranged and adapted to be in touching contact with the ground at the installation site, wherein the touch safety monitoring device comprises a measuring device which is operatively connected to the at least one contact plate on the one hand and to the at least one touch point on the other hand,
   wherein the touch safety monitoring device comprises as the at least one contact plate two contact plates which are spaced apart from each other and are adapted to be in touching contact with the ground at the installation site, wherein the two contact plates are electrically connected in parallel with each other to the measuring device,
   wherein the measuring device is operatively connected to the two contact plates and adapted to measure an impedance between the contact plates, and
   wherein the energy supply connector has a charging cable comprising a protective conductor, wherein the touch safety monitoring device, in particular the measuring device, is electrically connected to the protective conductor.

13. A mobile electric energy supply device, comprising:
   at least one energy supply connector for drawing energy from the energy supply device,
   a ground grounding device adapted to cooperate at an installation site with a ground of the installation site of the energy supply device to provide grounding for the energy supply device, and
   a touch safety monitoring device adapted to monitor at least one touch point disposed on or electrically connected to the energy supply device for touch safety,
   wherein a first contact plate of the two contact plates is electrically connected to the at least one touch point via a first measuring conductor, wherein a second contact plate of the two contact plates is electrically connected to the at least one touch point via a second measuring conductor, a fourth measuring resistor being arranged in the first measuring conductor, a fifth measuring resistor being arranged in the second measuring conductor, and the measuring device being adapted to measure a first electrical voltage drop across the fourth measuring resistor and to measure a second electrical voltage drop across the fifth measuring resistor.

14. The mobile energy supply device according to claim 13, wherein the touch safety monitoring device comprises at least one contact plate arranged and adapted to be in touching contact with the ground at the installation site, wherein the touch safety monitoring device comprises a measuring device which is operatively connected to the at least one contact plate on the one hand and to the at least one touch point on the other hand.

15. The mobile energy supply device according to claim 13, wherein the measuring device comprises two contact plates which are spaced apart from each other and are adapted to be in touching contact with the ground at the installation site, wherein the two contact plates are electrically connected in parallel with each other to the measuring device, and
   wherein the measuring device is operatively connected to the two contact plates and adapted to measure an impedance between the contact plates.

* * * * *